United States Patent [19]

Morris, Jr. et al.

[11] Patent Number: 5,200,708
[45] Date of Patent: Apr. 6, 1993

[54] APPARATUS FOR THE VIRTUAL EXPANSION OF POWER SUPPLY CAPACITY

[75] Inventors: Robert E. Morris, Jr.; Mark R. Anderson, both of Indianapolis, Ind.

[73] Assignee: Thomson Consumer Electronics, Inc., Indianapolis, Ind.

[21] Appl. No.: 755,581

[22] Filed: Sep. 11, 1991

[51] Int. Cl.⁵ .............................................. H03F 3/68
[52] U.S. Cl. .............................. 330/124 R; 330/127; 381/109
[58] Field of Search .................. 330/124 R, 127, 129, 330/279, 285, 295, 297; 381/104, 107, 108, 109, 120, 121

[56] References Cited

U.S. PATENT DOCUMENTS

| | | | |
|---|---|---|---|
| 3,681,704 | 8/1972 | Davidson | 381/109 X |
| 4,439,740 | 3/1984 | Warrington | 330/124 R |
| 4,490,683 | 12/1984 | Rhee | 381/120 X |

OTHER PUBLICATIONS

Data Sheets, RCA Solid State, CA3134 Types, File No. 1097, Linear Integrated Circuits, TV Sound IF and Audio Output Subsystems, Feb. 1985.
Linear Integrated Circuits Application Note, RCA Solid State Division, ICAN-6728, Application of the CA3134G Sound IF and Output Subsystem in Television Receivers, by G. M. Harayda, Oct. 1978.

*Primary Examiner*—Steven Mottola
*Attorney, Agent, or Firm*—Joseph S. Tripoli; Peter M. Emanuel; Frederick A. Wein

[57] ABSTRACT

Apparatus is provided for the virtual expansion of the power providing capacity of a power supply, e.g., for a stereophonic audio system with a given number of channels which may be selectively increased to provide a surround audio system. A plurality of amplifiers, each having an adjustable gain, are powered from the power supply. The current drawn from the power supply is sensed. When additional amplifiers are activated, the total amount of power drawn by all of the amplifiers can exceed a predetermined level which corresponds to the original plurality of amplifiers. However, when it is sensed that the total amount of power drawn exceeds the predetermined level, the gain of all of the amplifiers is reduced so that the power drawn from the power supply does not exceed the predetermined level. Thus, the virtual power providing capacity of the power supply is expanded to power the additional amplifiers.

8 Claims, 1 Drawing Sheet

APPARATUS FOR THE VIRTUAL EXPANSION OF POWER SUPPLY CAPACITY

BACKGROUND

The present invention relates to a power supply arrangement for an audio system such as may be employed in a television receiver.

Television receivers have loudspeakers included within the cabinet of the television receiver which are permanently connected to the signal providing power output stages. Some television receivers, especially those with stereophonic sound and other multiple channel sound processing sections, have provisions for connecting additional loudspeakers to the receiver. One multiple channel sound processing system is known as "PROLOGIC" TM sound system. The "PROLOGIC" TM system has four sound channels (left, center, right, and surround) instead of just the normal left and right stereophonic sound channels.

The additional channels can cause the doubling of the total power drawn from the power supply which provides power to the audio system. For reasons of economy, it is often desirable not to have to double the power providing capacity of the power supply to accommodate two extra loudspeakers which may, or may not, be connected to the television receiver. An increased the power supply capacity can require substantially larger components, having additional cost and weight, require additional space in the television receiver, and increase the heat generated within the receiver chassis. Additionally, if the power is drawn from the horizontal flyback circuit, there can be a problem with audio modulation of the video display.

Accordingly, it is desirable to maintain essentially the same audio power output from the receiver and the corresponding power supply providing power to the audio circuits whether or not the additional speaker connections to the television receiver are utilized.

In the CTC-130 color television chassis of the RCA Corporation of Indianapolis, Ind., USA, a power supply protection circuit is used for protecting the individual audio power amplifiers when an improper load, i.e., a short circuit or the like, is connected to the output. Specifically, in the CTC-130 chassis, a resistor is connected in series between the power supply and the power amplifiers, and a sensing circuit is used to sense the current drawn through the resistor. When the current drawn from the power supply exceeds a predetermined value, the sensing circuit reduces the control voltage to the electronic volume control terminals of the respective power amplifiers. As a result, the current drawn from the power supply is reduced and damage to the power output stages is prevented.

SUMMARY OF THE INVENTION

Briefly, the present invention is directed to apparatus for the virtual expansion of the power providing capacity of a power supply, e.g., for an audio system with a given number of channels which may be selectively increased. A plurality of amplifiers, each having a voltage adjustable gain, is coupled to the power supply and draw current therefrom. The current drawn from the power supply is sensed and the gain of the circuits are adjusted for maintaining the total power drawn from the power supply at a predetermined level. When additional amplifiers are activated, the total amount of power drawn by the plurality of amplifiers exceeds the predetermined level which is set for providing power for the original plurality of amplifiers. As a result the gain of all of the amplifiers is reduced to maintain the power drawn from the power supply at the predetermined level. Thus, the virtual power providing capacity of the power supply is expanded to power the additional amplifiers.

DESCRIPTION OF THE DRAWING

During the following detailed description of the preferred embodiment of the invention, reference should be made to the accompanying Drawings wherein.

DETAILED DESCRIPTION OF THE PREFERRED EMBODIMENT

Figure 1:
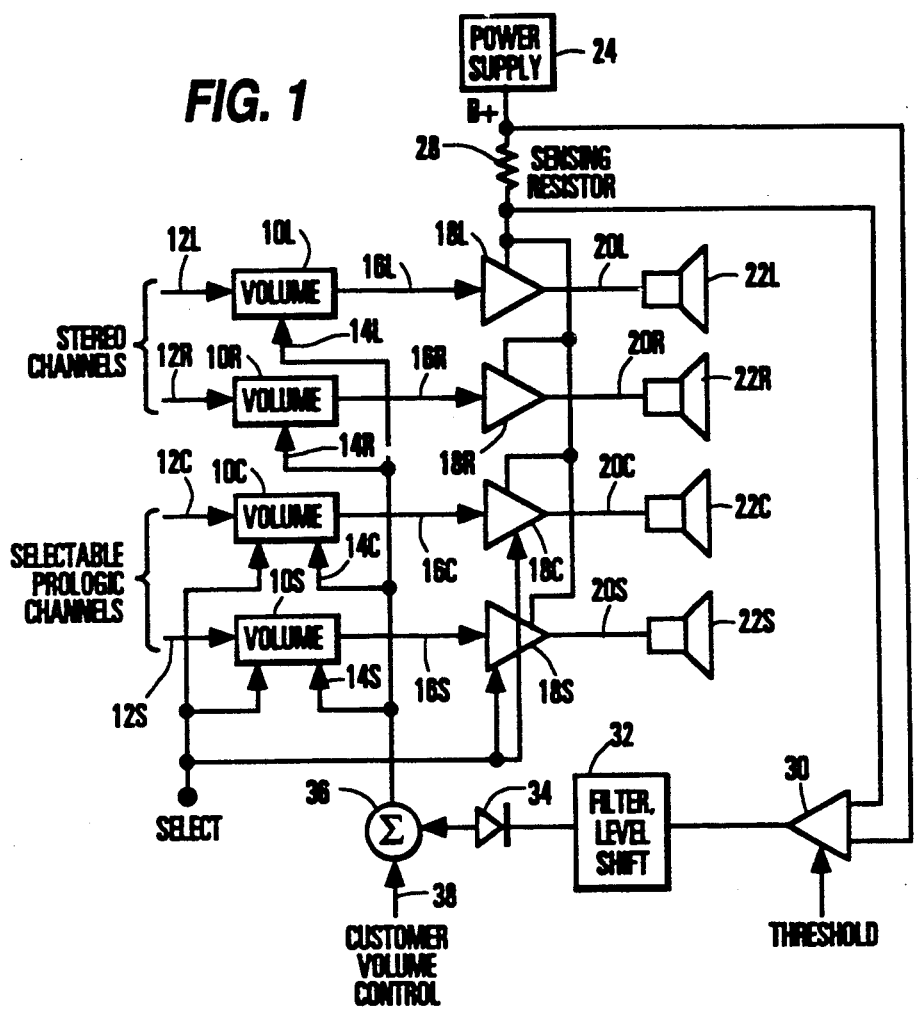
FIG. 1 shows a block diagram of an audio system including a power supply arrangement according to aspects of the present invention.

The arrangement shown in FIG. 1 uses a resistor connected in series with the power supply which supplies power to a plurality of gain controllable amplifiers included in respective audio channels, at least some of which may be selectively activated. The voltage drop across the resistor, which is indicative of the current drawn from the power supply, is sensed by a sensing circuit. When that current exceeds a predetermined threshold value, the gain of each of the gain controllable amplifiers is reduced. Because of the reduced gain, the output level of each of the power amplifiers will decrease causing a corresponding decrease in the current drawn from the power supply. Accordingly, the system will maintain the current drawn near the predetermined threshold value set for powering less than all of the plurality of amplifiers. In the exemplary embodiment, the predetermined threshold value is adjusted to be slightly above the maximum current drawn by the basic two channel stereo system. When additional channels are selected, e.g., to produce a "surround sound" effect, the system will limit the total power to approximately the same power as that drawn by the basic stereo system. However, the same overall loudness as the basic two channel stereo system will be provided. Thus, the virtual power supply capacity is extended. Thus, a power supply capable of providing more power than is needed for the basic two channel stereo system is not necessary.

Referring now to the drawings, FIG. 1 shows an audio system of a television receiver or the like in which signal amplifier circuits 10L and 10R are provided in left and right audio channels for amplifying left and right audio signals provided at respective inputs 12L and 12R. The left and right audio signals may be derived from an appropriate signal source such as a stereophonic broadcast signal, a stereophonic tape recording, a compact disk, or the like. Amplifiers 10L and 10R are gain controllable amplifiers and include terminals 14L and 14R. Output signals produced at outputs 16L and 16R are coupled to respective power amplifiers 18L and 18R for providing amplified output signals via terminals 20L and 20R to respective loudspeakers 22. Power amplifiers 18 are powered from a power supply 24 which provides a supply voltage B+ power to amplifiers 18L and 18R through a sensing resistor 28.

The audio system also includes two additional audio channels for providing center and surround audio signals for additional sound ambience in accordance with the Dolby Laboratories "Prologic" TM format. The center (c) and surround (s) channels may be selectively activated in response to a user initiated command signal (select). The center and surround channels include gain control amplifier circuits 10C and 10S, power amplifiers 18C and 18S, and loudspeakers 22C and 22S. Additional power amplifiers 18C and 18S are also powered from the power supply 24 and when the amplifiers are activated, the additional current is sensed as part of the total voltage across resistor 28. The voltage drop across resistor 28 is proportional to the average current through resistor 28 which is representative of the power output of amplifiers 18L, 18R, 18C and 18S. The voltage across sensing resistor 28 is amplified by amplifier 30 when the voltage exceeds a threshold level. The value of resistor 28, and the amount of amplification and the threshold level of amplifier 30 are set so that a gain reduction control signal is generated at a current through resistor 28 which is indicative of a current level which is a little above full power output from power supply 24 for amplifiers 18L and 18R of the two basic left and right stereo channels. The output of threshold amplifier 30 is filtered and level shifted by a section 32 and the resultant signal is coupled through diode 34 to summing junction 36. Summing junction 36 sums the output filter and level shifter section 32 with the customer volume control setting provided at an input 38. The resulting gain controlling voltage is coupled to gain control terminals 14L, 14R, 14C and 14S of respective amplifiers 10L, 10R, 10C and 10S in order to reduce the gain of amplifiers 10L, 10R, 10C and 10S so as to reduce the total audio output power of amplifiers 18L, 18R, 18C and 18S within the output power level of amplifiers 18L and 18R by themselves. In other words, the system does not affect the volume until a "loud" input signal or a user sets the volume level excessively high. The current sensed for resistors 28 is reduced to bring the voltage generated across sensing resistor 28 back to approximately the threshold level of amplifier 30. In this way, the system will maintain the current drawn from the power supply to near the threshold level. Thus, the circuit senses current drawn by amplifiers 18L, 18R, 18C and 18S which is in excess of the current which is drawn by amplifiers 18L and 18R alone, and reduces the power output to all channels to the output which corresponds to the rated capacity of the power supply for amplifiers 18L and 18R alone. In this way, the virtual power providing capacity of the power supply is expanded.

Figure 2:
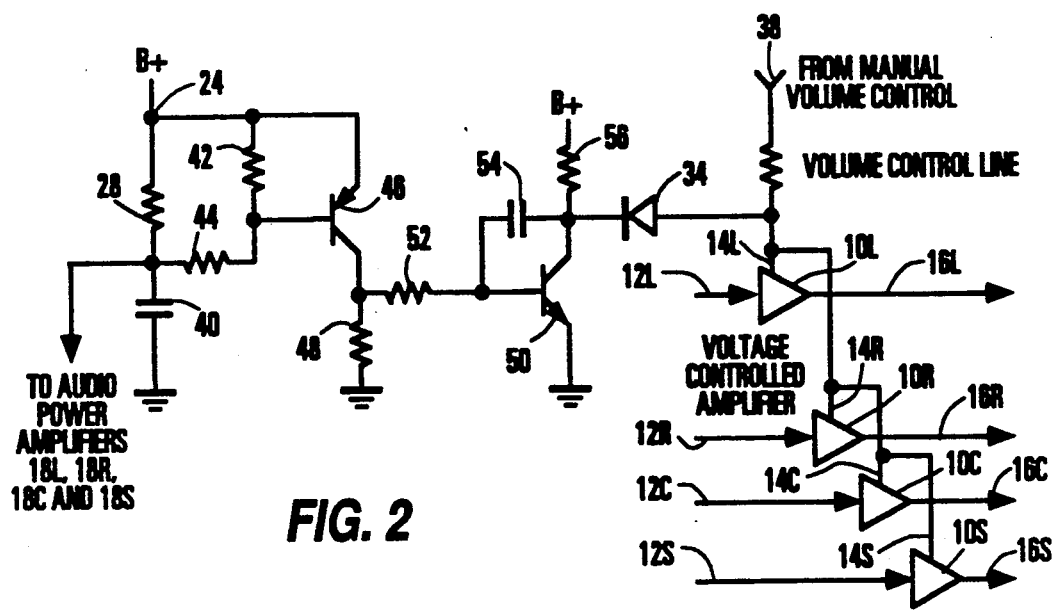
FIG. 2 is a schematic showing details of the sensing, threshold, smoothing, level shifting, and control circuitry shown in block form in FIG. 1.

FIG. 2 shows the preferred embodiment of the control loop components 30, 32, 34 and 36.

Resistor 28 and capacitor 40 form a typical power supply filter for decoupling between components powered by a common power supply. The voltage generated across resistor 28 is an indication of the average current flowing to amplifiers 18L, 18R, 18C and 18S. Resistors 42 and 44 provide a voltage divided version of the voltage developed across resistor 28 to the base of transistor 46. An output signal from amplifier transistor 46 developed across resistor 48 occurs if the base-emitter junction of transistor 46 is forward biased. The values of resistors 42 and 44 are chosen based upon the value of resistor 28 to establish the threshold of conduction of transistor 46. Specifically, transistor 46 is biased to be "turned on" when the voltage across resistor 42 is approximately is 0.65 volts when the maximum rated power is supplied by power supply 24.

The output signal of transistor 46 across resistor 48 is filtered, level shifted, and inverted by a Miller integrator arrangement including a transistor 50, resistors 52 and 56, and capacitor 54. Resistor 52 and capacitor 54 form the time constant for the system. This time constant accomplishes two functions: 1) it slows the system response to prevent annoying "pumping" of the system gain in response to changes in signal, and 2) provides a dominant-pole compensation to prevent system oscillation due to the complex and varied response of the audio system. The output voltage developed at the collector of transistor 52 across resistor 56 is coupled through isolation diode 34 to gain control inputs 14L, 14R, 14C and 14S of gain controlled amplifiers 10L, 10R, 10C and 10S. When the sensed voltage across resistor 28 is below the threshold level, the collector of transistor 50 is high, diode 34 is reverse biased, and the coupling to control inputs 14L, 14R, 14C and 14S is removed. Thus, the only control of gain in this mode is that derived from the consumer volume control signal at line 38. When the voltage across resistor 28 is above the threshold level, the voltage at collector 50 goes low enough to forward bias diode 34 and a gain (reduction) control signal is coupled to gain control inputs 14L, 14R, 14C and 14S. How much control is exerted depends upon how high the user has turned the volume setting and how loud the income signals are. Typically, lines 14L, 14R, 14C and 14S may be pulled down one or two volts. Voltage controlled amplifiers 10L, 10R, 10C and 10S can be included in pairs of tone-volume-balance control integrated circuits such as an LM1035 available from National Semiconductor Corporation. With the LM1035 IC, the maximum volume is produced at about 5.0 volts and minimum volume is produced at about 0.5 volts.

What is claimed is:
1. Apparatus comprising:
   a first number of circuits,
   a second number of circuits,
   power supply means for providing power to the first number of circuits, the first number of circuits drawing a predetermined amount of power from the power supply means,
   means for selectively enabling said power supply means to power the second number of circuits,
   means for sensing the amount of the power drawn from the power supply means by the first and second number of circuits, and
   means for reducing the total power drawn from the power supply means in response to the sensed power drawn when the amount of power drawn by the first and second number of circuits exceeds the predetermined amount of power.
2. The apparatus of claim 1 wherein at least some of said first number of circuits has an adjustable gain, and the total power drawn from the power supply is reduced by lowering the gain of the at least some of the first number of circuits.
3. The apparatus of claim 1 wherein at least some of said second number of circuits has an adjustable gain, and the power drawn from the power supply is reduced by lowering the gain of the at least some of second number of circuits.
4. The apparatus of claim 1 wherein the first number of circuits are two audio channels of a stereophonic sound system and the second number of circuits are additional audio channels.

5. The apparatus of claim 4 wherein the additional number of audio channels in combination with the two audio channels of the stereophonic sound system form a surround sound system.

6. Apparatus comprising:
a plurality of variable gain amplifiers and at least one additional gain controllable amplifier which is selectably enabled to operate,
a power supply for supplying all power to the amplifiers,
means for reducing the gain of all of the amplifiers in response to the amount of power drawn from the power supply so that the power drawn from the power supply does not exceed the maximum amount of power drawn by the plurality of amplifiers not including the selectable amplifier.

7. Apparatus comprising:
a first gain controllable amplifier and at least a second gain controllable amplifier which is selectably enabled to operate,
a power supply for powering all of the amplifiers,
sensing means for sensing the power drawn from the power supply, and
gain control means responsive to the sensed power drawn from the power supply for reducing the gain of all of the amplifiers so that the power drawn from the power supply does not exceed the maximum power drawn by the first amplifier.

8. Apparatus comprising:
a power supply;
a first circuit coupled to said power supply and capable of drawing a predetermined amount of power from it;
a second circuit;
means for selectively coupling said second circuit to said power supply so that said second circuit also draws power from said power supply,
means for sensing coupled to at least said first circuit and responsive to the amount of power drawn from said power supply for reducing the amount of power drawn from said power supply when the amount of power drawn from said power supply by said first and second circuits exceeds said predetermined amount.

* * * * *